United States Patent
Innocent

(10) Patent No.: US 10,432,211 B1
(45) Date of Patent: Oct. 1, 2019

(54) IMAGING SYSTEMS WITH SUB-RADIX-2 CHARGE SHARING SUCCESSIVE APPROXIMATION REGISTER (SAR) ANALOG-TO-DIGITAL CONVERTERS

(71) Applicant: SEMICONDUCTOR COMPONENTS INDUSTRIES, LLC, Phoenix, AZ (US)

(72) Inventor: Manuel H. Innocent, Wezemaal (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/361,602

(22) Filed: Mar. 22, 2019

Related U.S. Application Data

(63) Continuation of application No. 16/137,876, filed on Sep. 21, 2018, now Pat. No. 10,291,251.

(51) Int. Cl.
| | | |
|---|---|---|
| *H03M 1/44* | (2006.01) | |
| *H03M 1/14* | (2006.01) | |
| *H03M 1/46* | (2006.01) | |
| *H03M 1/12* | (2006.01) | |
| *H04N 5/378* | (2011.01) | |
| *H03M 1/10* | (2006.01) | |

(52) U.S. Cl.
CPC ......... *H03M 1/442* (2013.01); *H03M 1/1038* (2013.01); *H03M 1/122* (2013.01); *H03M 1/14* (2013.01); *H03M 1/46* (2013.01); *H04N 5/378* (2013.01)

(58) Field of Classification Search
CPC ...... H03M 1/442; H03M 1/1038; H03M 1/46; H03M 1/14; H04N 5/378
USPC .................................................. 341/144, 155
See application file for complete search history.

(56) References Cited

U.S. PATENT DOCUMENTS

| | | | | |
|---|---|---|---|---|
| 5,262,779 A | * | 11/1993 | Sauer ................... | H03K 5/2481 327/362 |
| 6,646,583 B1 | * | 11/2003 | Fossum ............... | H03M 1/1215 341/120 |

(Continued)

OTHER PUBLICATIONS

Craninckx et al., "A 65j/Conversion-Step 0-to-50MS/s 0-to-0.7mW 9b Charge-Sharing SAR ADC in 90nm Digital CMOS", IEEE ISSCC 2007, San Francisco, California, USA; Feb. 11-15, 2007.

(Continued)

*Primary Examiner* — Brian K Young
(74) *Attorney, Agent, or Firm* — Treyz Law Group, P.C.; Jason Tsai; Joseph F. Guihan

(57) ABSTRACT

An image sensor may contain an array of imaging pixels arranged in rows and columns. Each column of imaging pixels may be coupled to a column line which is used to read out imaging signals from the pixels. The column line may be coupled to an analog-to-digital converter for converting analog imaging signals from the pixels to digital signals. The analog-to-digital converter may be implemented as a charge sharing successive approximation register (SAR) analog-to-digital converter (ADC). The SAR ADC may include a comparator coupled to a feedback digital-to-analog converter (DAC). The comparator may have a non-zero comparator offset. The feedback DAC may include capacitors that are scaled using a sub-radix-2 sizing scheme to help improve tolerance to the comparator offset while enabling resolutions of up to 10-bits or more.

19 Claims, 7 Drawing Sheets

(56) References Cited

U.S. PATENT DOCUMENTS

| | | | |
|---|---|---|---|
| 8,395,538 B2* | 3/2013 | Das | H03M 1/68 |
| | | | 341/156 |
| 8,502,723 B2* | 8/2013 | Chen | H03M 1/1061 |
| | | | 341/120 |
| 8,933,385 B2 | 1/2015 | Wang et al. | |
| 9,231,610 B2 | 1/2016 | Gou et al. | |
| 9,450,596 B2 | 9/2016 | Kim et al. | |
| 9,461,664 B2 | 10/2016 | Sampath | |
| 9,864,054 B2 | 1/2018 | Liu et al. | |
| 9,905,603 B1 | 2/2018 | Kim | |
| 2010/0052957 A1 | 3/2010 | Craninckx | |
| 2019/0045150 A1 | 2/2019 | Geurts | |

OTHER PUBLICATIONS

Kull et al., "A 10b 1.5GS/s Pipelined-SAR ADC with Background Second-Stage Common-Mode Regulation and Offset Calibration on 14nm CMOS FinFET", IEEE ISSCC 2017, San Francisco, California, USA, Feb. 5-9, 2017.

Liu et al., "A 12-bit, 45-MS/s, 3-mW Redundant Successive-Approximation-Register Analog-to-Digital Converter With Digital Calibration" IEEE Journal of Solid-State Circuits, vol. 46, No. 11, Nov. 2011.

Rabuske et al., "An 8-bit 0.35-V 5.04-fJ/Conversion-Step SAR ADC With Background Self-Calibration of Comparator Offset", IEEE Transactions on Very Large Scale Integration (VLSI) Systems, vol. 23, No. 7, Jul. 2015.

* cited by examiner

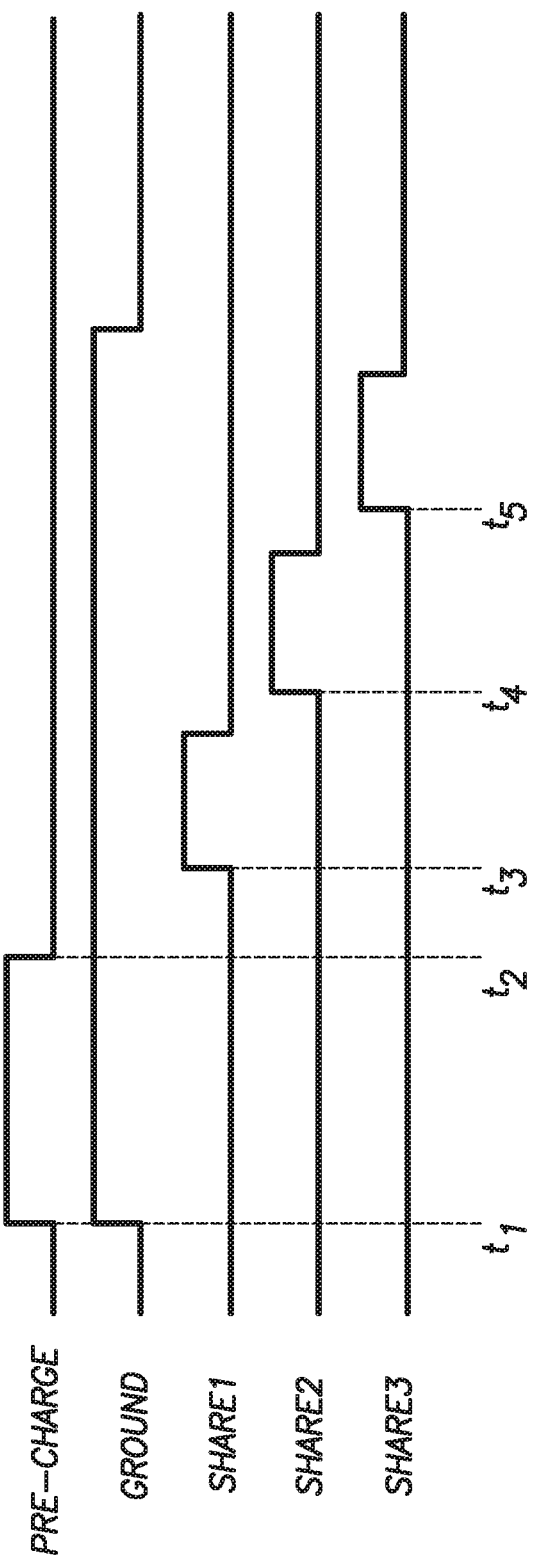

IMAGING SYSTEMS WITH SUB-RADIX-2 CHARGE SHARING SUCCESSIVE APPROXIMATION REGISTER (SAR) ANALOG-TO-DIGITAL CONVERTERS

This application is a continuation of U.S. patent application Ser. No. 16/137,876, filed Sep. 21, 2018, which is hereby incorporated by reference herein in its entirety. This application claims the benefit of and claims priority to U.S. patent application Ser. No. 16/137,876, filed Sep. 21, 2018.

BACKGROUND

This relates generally to analog-to-digital converters, and more specifically, to massively parallel analog-to-digital converters. Massively parallel analog-to-digital converters may be included within image sensors.

Modern electronic devices such as cellular telephones, cameras, and computers often use digital image sensors. Image sensors (sometimes referred to as imagers) may be formed from a two-dimensional array of image sensing pixels. The array of image sensing pixels are typically arranged in pixel rows and columns. Each pixel includes a photosensitive layer that receives incident photons (light) and converts the photons into electrical charge. Column sensing circuitry is typically coupled to each pixel column for reading out image signals from the image pixels.

Conventional image sensors often include analog-to-digital conversion circuitry for converting analog signals generated from the image pixels to digital signals. In one configuration, an image sensor is provided with charge sharing successive approximation register (SAR) analog-to-digital converters (ADCs). A "charge sharing" SAR ADC has a feedback digital-to-analog converter (DAC) that is configured to successively add pre-charged capacitors in parallel based on the output of a comparator. This is different from the more traditional "charge redistribution" SAR ADC where all capacitance of the feedback DAC is initially connected at the beginning of the conversion and individual capacitors are switched to different reference voltage levels based on the output of the comparator.

As described above, the capacitance of the feedback DAC in a charge sharing ADC changes every cycle. Successively adding in capacitors will change the corresponding input charge. Due to non-idealities, the comparator will exhibit some non-zero comparator offset, which will affect the equivalent input voltage in every cycle of the operation. In other words, the charge sharing SAR ADC is very sensitive to comparator offset, which can limit the use of the charge sharing SAR architecture to less than 10 bits.

It is within this context that the embodiments herein arise.

BRIEF DESCRIPTION OF THE DRAWINGS

FIG. 8B is a timing diagram illustrating the operation of the capacitor array shown in FIG. 8A in accordance with an embodiment.

DETAILED DESCRIPTION

Embodiments of the present invention relate to image sensors, and more particularly to analog-to-digital conversion within image sensors. It will be recognized by one skilled in the art, that the present exemplary embodiments may be practiced without some or all of these specific details. In other instances, well-known operations have not been described in detail in order not to unnecessarily obscure the present embodiments.

Figure 1:
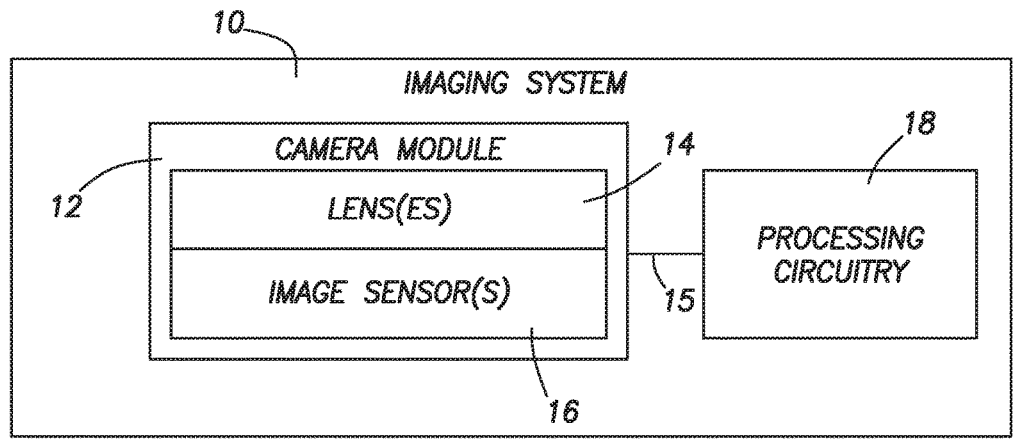
FIG. 1 is a diagram of an illustrative electronic device in accordance with an embodiment.

FIG. 1 is a diagram of an illustrative electronic device in accordance with an embodiment of the present invention. As shown in FIG. 1, imaging system 10 may be a portable imaging system such as a camera, automotive imaging system, cellular telephone, video camera, video surveillance system, or any other desired imaging device that captures digital image data. System 10 may include a camera module 12 that is used to convert incoming light into digital image data. Camera module 12 may include an array of lenses 14 and corresponding image sensor(s) 16. Lens(es) 14 and image sensor(s) 16 may be mounted in a common package and may provide image data to processing circuitry 18. Image sensors 16 may include one or more image sensors and lens array 14 may include one or more corresponding lenses.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensor array 16 or an integrated circuit within module 12 that is associated with image sensor array 16). Image data that has been captured and processed by camera module 12 may, if desired, be further processed and stored using processing circuitry 18. Processed image data may, if desired, be provided to external equipment (e.g., a computer or other device) using wired and/or wireless communications paths coupled to processing circuitry 18.

Each pixel in image sensor(s) 16 may receive light of a given color by providing each image pixel with a color filter. The color filters that are used for image sensor pixels in the image sensors may, for example, be red filters, blue filters, and green filters. Other filters such as white color filters, dual-band IR cutoff filters (e.g., filters that allow visible light and a range of infrared light emitted by LED lights), etc. may also be used.

Figure 2:
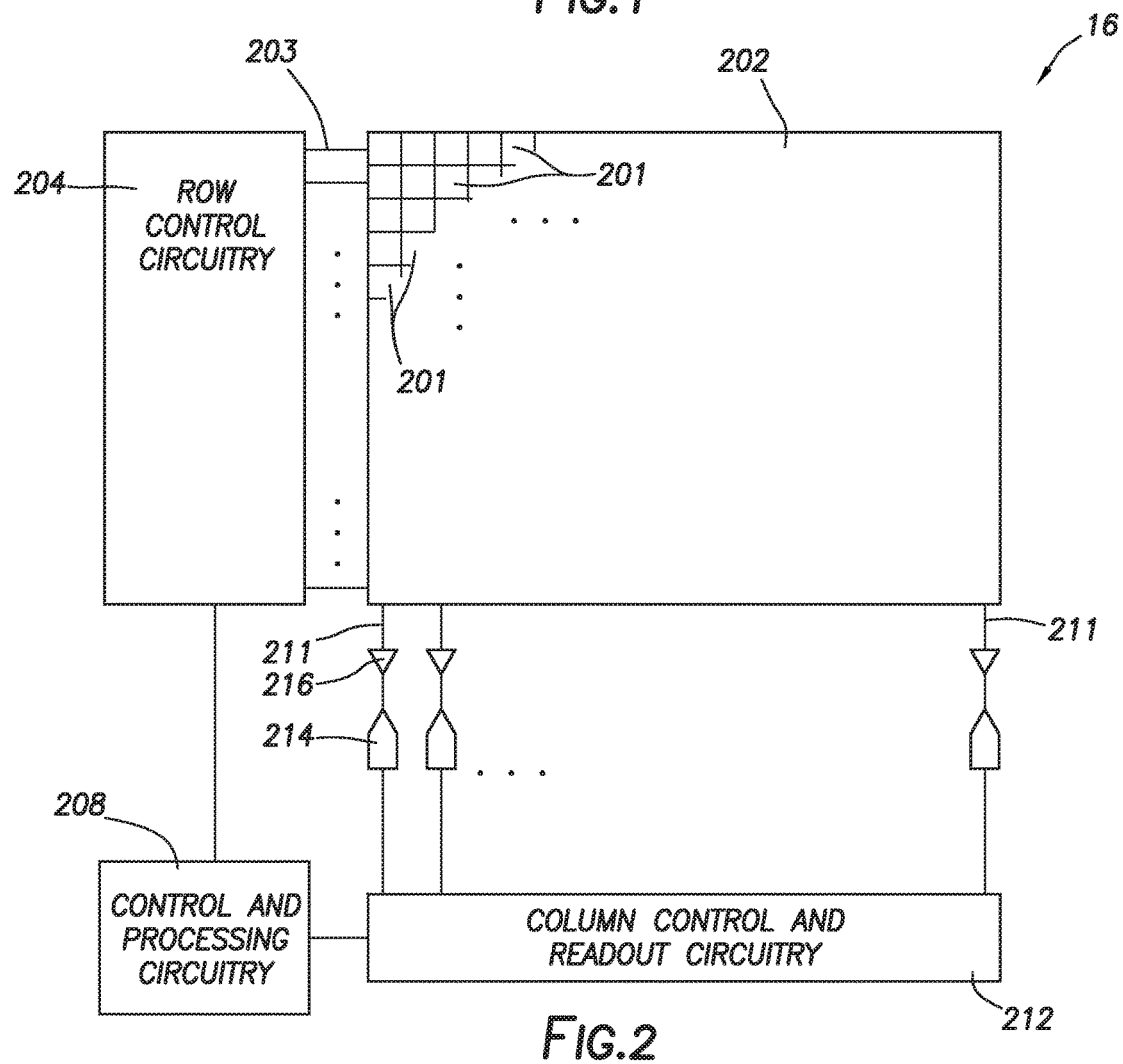
FIG. 2 is a diagram of an illustrative image pixel array in an image sensor in accordance with an embodiment.

FIG. 2 is a diagram of an illustrative image pixel array in an image sensor As shown in FIG. 2, the image sensor (e.g., image sensor 16 of FIG. 1) may include pixel array 202 having multiple pixels 201 (sometimes referred to herein as image pixels 201 or image sensor pixels 201) and row control circuitry 204 that is coupled to image pixel array 202. Row control circuitry 204 may provide pixel control signals (e.g., row select signals, pixel reset signals, charge transfer signals, etc.) to pixels 201 over corresponding row control lines 203 to control the capture and read out of images using image sensor pixels in array 202.

Image sensor 16 may include column control and readout circuitry 212 and control and processing circuitry 208 that is coupled to row control circuitry 204 and column circuitry 212. Column control circuitry 212 may be coupled to array 202 via multiple column lines 211. For example, each column of pixels 201 in array 202 may be coupled to a respective column line 211. A corresponding analog-to-digital converter (ADC) 214 and column amplifier 216 may be interposed on each column line 211 for amplifying analog signals captured by array 202 and converting the captured analog signals to corresponding digital pixel data. Column control and readout circuitry 212 may be coupled to external hardware such as processing circuitry. Column control and readout circuitry 212 may perform column readout based on signals received from control and processing circuitry 208. Column control and readout circuitry 212 may include column ADC circuits 214 and column amplifiers 216.

Amplifier 216 may be configured to receive analog signals (e.g., analog reset or image level signals) from pixel array 202 and to amplify the analog signals. The analog signals may include data from a single column of pixels or from multiple columns of pixels, depending on the application. ADC 214 may receive amplified analog signals from amplifier 216 and may perform analog-to-digital conversion operations on the analog signals to generate digital data. The digital data may be transmitted to column control and readout circuitry 212 for processing and readout.

Figure 3:
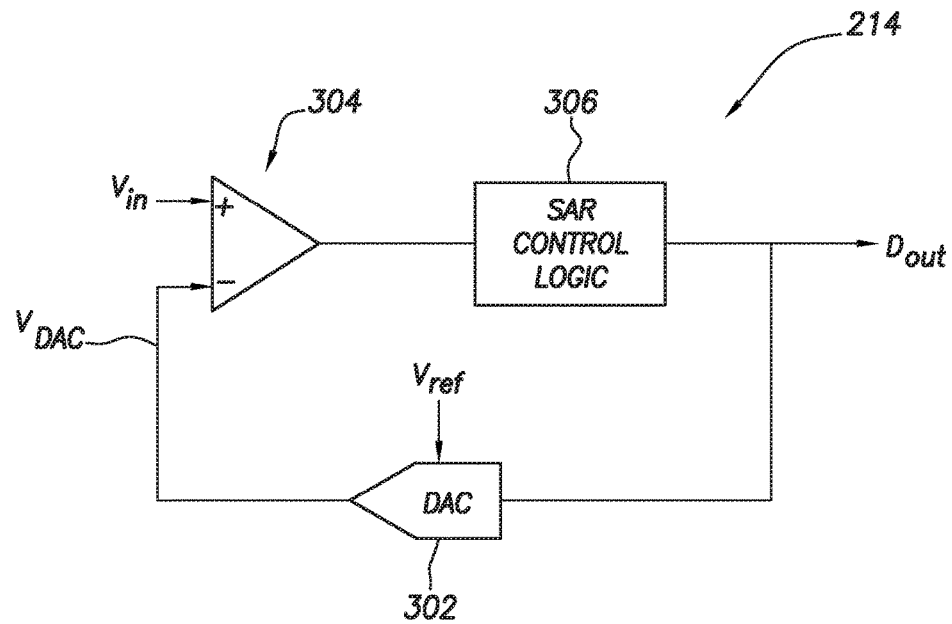
FIG. 3 is a schematic diagram of an illustrative analog-to-digital converter (ADC) that may be included in an image sensor in accordance with an embodiment.

FIG. 3 is a schematic diagram of an illustrative analog-to-digital converter (ADC) that may be included in an image sensor (e.g., ADC 214 in FIG. 2). As discussed in connection with FIG. 2, ADC 214 may receive analog signals from pixel array 202. ADC 214 may receive an input signal Vin. The input signal Vin may be an analog signal from one or more pixels 201 in pixel array 202 (for example, received over column line 211). ADC 214 may be used to convert input analog signal Vin to digital pixel data.

In accordance with an embodiment, ADC 214 may be a successive-approximation-register (SAR) ADC. A successive-approximation-register ADC uses a binary search algorithm that is implemented using a digital-to-analog converter (DAC) 302, comparator 304, and successive-approximation-register (SAR) control logic 306. DAC 302 may output an analog signal $V_{DAC}$ that is compared to pixel signal Vin using comparator 304. The voltage output by DAC 302 ($V_{DAC}$) may be varied, thereby allowing successive comparisons to Vin. Each comparison may further narrow the range of possible values of Vin, with the number of comparisons determining the resolution of the conversion. DAC 302 may receive a reference voltage as input (Vref). The output voltage from DAC 302 may be a known function of Vref. As an example, $V_{DAC}$ may be equivalent to half of the reference voltage, a quarter of the reference voltage, three quarters of the reference voltage etc. DAC 302 may receive signals from SAR control logic 306 that determine the output of DAC 302.

Comparator 304 may receive voltage Vin at a first (positive) input and voltage $V_{DAC}$ at a second (negative) input. The comparator may compare the magnitude of voltage Vin to the magnitude of voltage $V_{DAC}$. The output of comparator 304 may be a signal that is provided to SAR control logic 306. The signal may have a value indicative of which signal has a higher voltage (e.g., the comparator output may be asserted at a logic high level "1" if Vin is greater than $V_{DAC}$, whereas the comparator output may be driven to a logic low level "0" if $V_{DAC}$ is greater than Vin).

SAR control logic 306 in FIG. 3 may sometimes be referred to as processing circuitry. Processing circuitry 306 may track the results of comparisons by comparator 304 and adjust the output of DAC 302 accordingly. Processing circuitry 306 may ultimately output the result Dout of the analog-to-digital conversion (i.e., a digital representation of Vin). DAC 302 may be any desired type of digital-to-analog converter. As an example, DAC 302 may be a charge sharing digital-to-analog converter. When DAC 302 is implemented as a charge sharing DAC, ADC 214 may be referred to as a charge sharing SAR ADC.

Figure 4:
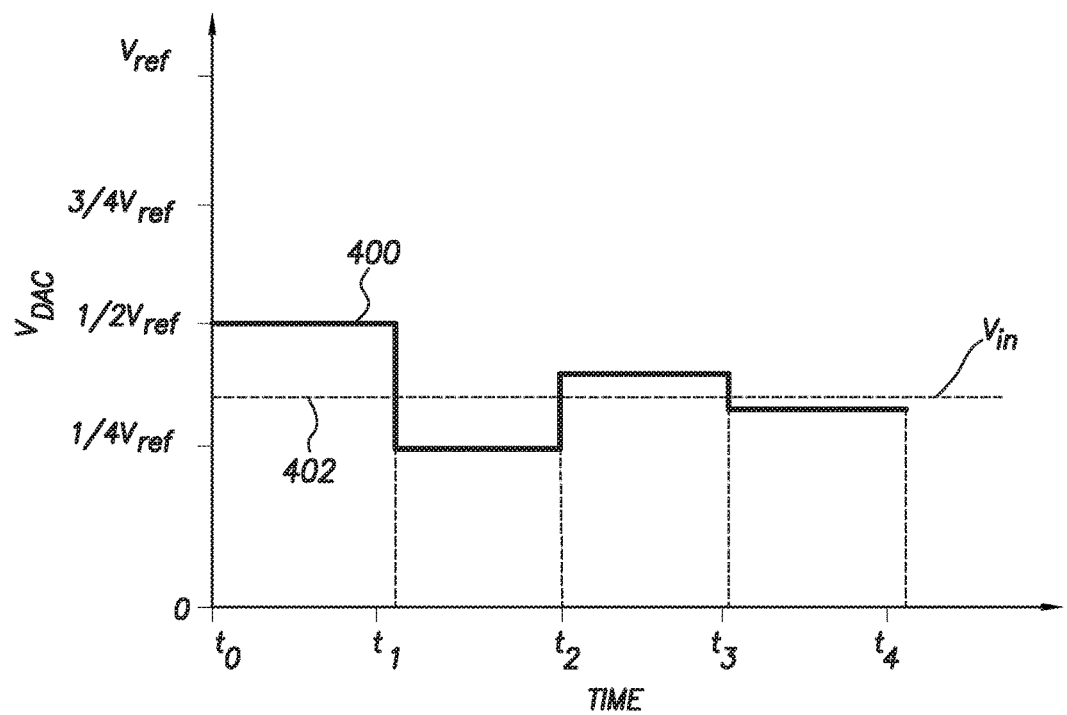
FIG. 4 is a graph showing operation of an illustrative successive-approximation-register (SAR) analog-to-digital converter (ADC) in accordance with an embodiment of the present invention.

FIG. 4 is timing diagram illustrating the operation of an illustrative successive-approximation-register analog-to-digital converter. The output voltage of DAC 302 ($V_{DAC}$ waveform 400) is shown changing over time as $V_{DAC}$ converges on the value of Vin. At $t_0$, the output of DAC 302 may be set to Vref/2 by SAR control logic 306. Between $t_0$ and $t_1$, $V_{DAC}$ (which is equal to Vref/2) is compared to Vin by comparator 304. In the example of FIG. 4, Vin—with a voltage level indicated by dotted line 402—is less than Vref/2. Accordingly, the comparator output may be provided at a logic low level "0" indicating that $V_{DAC}$>Vin. The SAR control logic 306 may set the most significant bit (MSB) to 0 as a result of this comparison.

The SAR control logic 306 then moves on to analyze the next bit. Between $t_1$ and $t_2$, $V_{DAC}$ is set to Vref/4 (the halfway point between 0 and Vref/2). In the example of FIG. 4, Vin is greater than Vref/4. Accordingly, the comparator output may be provided at a logic high level "1" indicating that Vin>$V_{DAC}$. The SAR control logic 306 may set the next bit to 1 as a result of this comparison. The SAR control logic 306 then moves on to analyze the next bit. Between $t_2$ and $t_3$, $V_{DAC}$ is set to 3Vref/8 (the halfway point between Vref/2 and Vref/4). In the example of FIG. 4, Vin is less than 3Vref/8. Accordingly, the comparator output may be provided at a logic low level "0" indicating that $V_{DAC}$>Vin. The SAR control logic 306 may set the next bit to 0 as a result of this comparison. Finally, the least significant bit (LSB) is analyzed between $t_3$ and $t_4$. Between $t_3$ and $t_4$, $V_{DAC}$ is set to 5Vref/16 (the halfway point between 3Vref/8 and Vref/4). In the example of FIG. 4, Vin is greater than 5Vref/16. Accordingly, the comparator output may be provided at a logic high level "1" indicating that $V_{IN}$>$V_{DAC}$. The SAR control logic 306 may set the least significant bit to 1 as a result of this comparison.

FIG. 4 shows how successive approximation may be used to converge upon the value of input voltage Vin. In the example of FIG. 4, only four bits of resolution are shown. However, it should be understood that any desired amount of resolution may be obtained by increasing the number of comparisons. The more comparisons performed, the smaller the possible range of values for Vin becomes. For example, in FIG. 4 Vin was determined as being greater than 5Vref/16 and less than 3Vref/8. Additional comparisons may narrow this range even further.

Additionally, it should be noted that Vin is determined as a function of Vref. In other words, a known voltage reference is provided to DAC 302. DAC 302 then produces an output voltage $V_{DAC}$. $V_{DAC}=D \times Vref$, where D is a multiplying factor (i.e., ½, ¼, ⅜, ¾, etc.). The SAR control logic 306 is used to determine the value of "D" for which $V_{DAC}=Vin$. Thereafter, SAR control logic 306 calculates Vin=D×Vref to determine the value of Vin.

Figure 5:
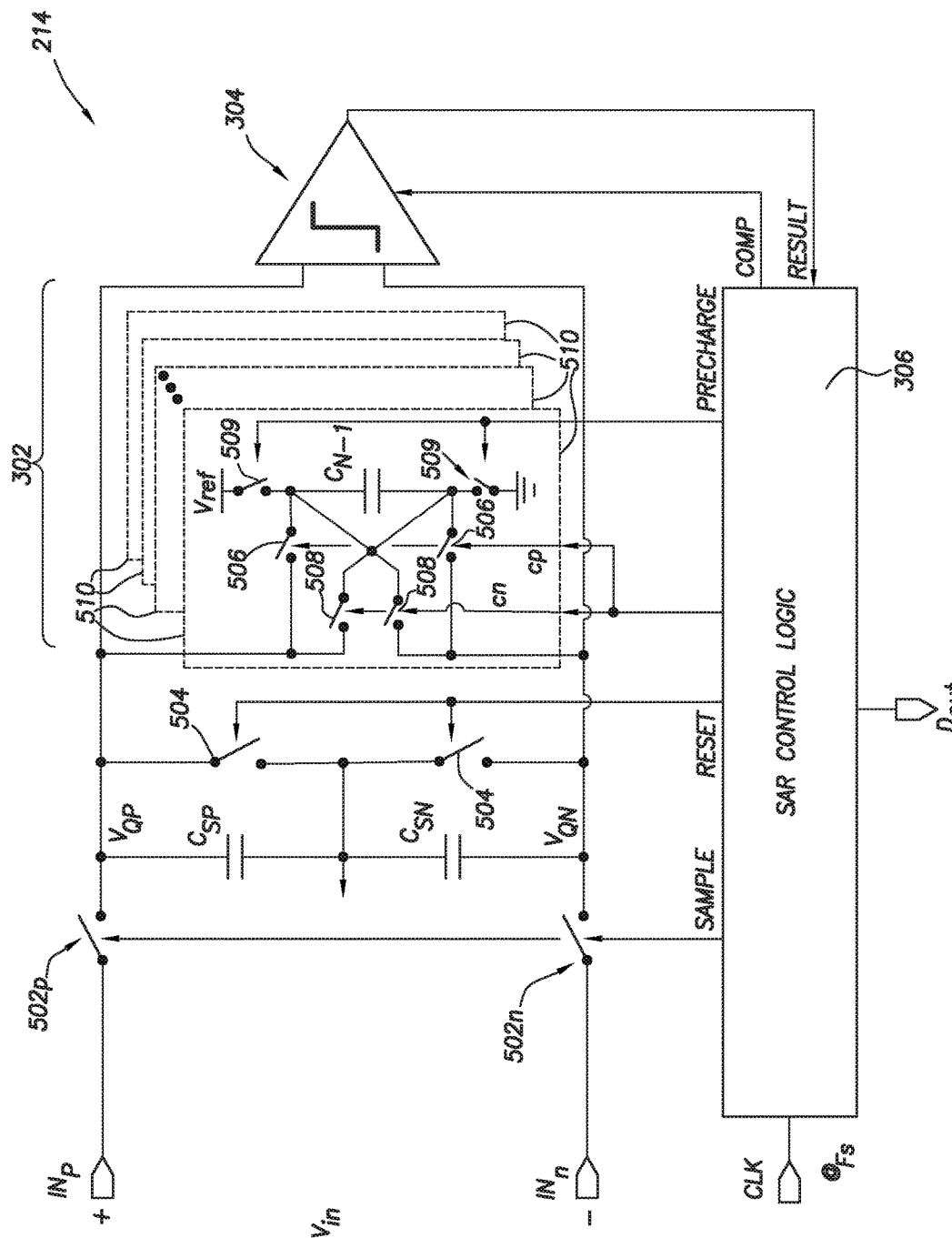
FIG. 5 is a circuit diagram of an illustrative SAR ADC with a differential input port in accordance with an embodiment.

FIG. 5 is a circuit diagram of an illustrative charge sharing SAR ADC 214 with a differential input port. As shown in FIG. 5, charge sharing SAR ADC 215 may have a first (positive) input port INp, a second (negative) input port INn, a first sampling switch 502p for selectively passing through signals from input port INp, a second sampling switch 502n for selectively passing through signals from input port INn, a first sampling capacitor $C_{sp}$ for sampling voltage $V_{QP}$ provided from input port INp via sampling switch 502p, a second sampling capacitor $C_{SN}$ for sampling voltage $V_{QN}$ provided from input port INn via sampling switch 502n, comparator 302 that receives sampled signals from capacitors $C_{SP}$ and $C_{SN}$, SAR control logic 306 that receives results from the comparator output, and DAC 302 also coupled to the inputs of comparator 304. Input voltage Vin may be provided across differential input ports INp and INn. Sampling capacitors $C_{SP}$ and $C_{SN}$ shown in FIG. 5 as being split by a ground terminal is merely illustrative. If desired, the sampling capacitors need not be implemented in a split configuration. Sampling capacitors $C_{SP}$ and $C_{SN}$ may be selectively reset using capacitor reset switches 504. SAR control logic 306 may receive a clock signal CLK at a sampling rate Fs, may output control signals for turning on and off sampling switches 502p/502n and capacitor reset switches 504, and may output final output signal Dout.

Still referring to FIG. 5, DAC 302 may include multiple capacitors that can be selectively coupled to the comparator input ports in parallel, as indicated by dotted boxes 510. For an N-bit charge sharing SAR ADC, DAC 302 may include N capacitors. As an example, a 10-bit charge sharing SAR ADC will include ten capacitors $C_9, C_8, C_7, \ldots, C_0$ within DAC 302. Thus, in general, an N-bit charge sharing SAR ADC may include N capacitors $C_{N-1}, C_{N-2}, C_{N-3}, \ldots, C_1, C_0$ within DAC 302. The N capacitors 510 within DAC 302 may all be pre-charged to known reference voltage level Vref by selecting turning on switches 509 using SAR control logic 306. Each of the N capacitors within DAC 302 may be selectively coupled to in the input ports of comparator 304 in a first polarity (e.g., by using SAR control logic 306 to assert control signal cp to turn on switches 506) or in a second polarity (e.g., by using SAR control logic 306 to assert control signal cn to turn on switches 508).

Figure 6:
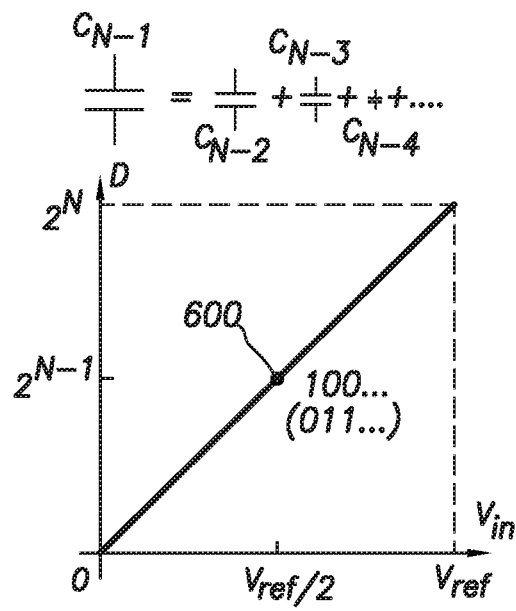
FIG. 6 is a diagram of a transfer curve of a conventional SAR ADC with a radix-2 capacitor scaling scheme.

In conventional charge sharing SAR ADCs, the DAC capacitors are binary scaled (i.e., the DAC capacitors will have a radix-2 sizing scheme). In other words, an N-bit charge sharing SAR ADC will include N DAC capacitors with capacitance values $C, 2C, 4C, 8C, 16C, \ldots, 2^{N-1}C$. FIG. 6 is a diagram of a transfer curve of a conventional charge sharing SAR ADC with a radix-2 capacitor scaling scheme, where for any Nth capacitor, its capacitance $C_{N-1}$ is equal to the sum of the capacitances of all smaller capacitors $C_{N-2}, C_{N-3}, C_{N-4}, \ldots, C_0$ plus an additional $C_0$. As shown in FIG. 6, the ADC will compute the MSB based on a single decision point 600. If the DAC comparison is above decision point 600, the MSB will be equal to 1. Conversely, if the DAC comparison is below decision point 600, the MSB will be equal to 0.

The accuracy of this comparison is, however, highly dependent on a comparator offset that is inherently associated with the ADC comparator. As described above in connection with FIGS. 3 and 4, a SAR ADC will introduce an additional capacitor every clock cycle to change $V_{DAC}$, which is fed as an input to the comparator. As a result, the input-referred offset of the comparator will change over time (e.g., the comparator offset voltage may be effectively amplified at each successive comparison). Prior methods of solving this problem focus primarily on comparator offset calibration techniques. However, even with comparator offset calibration applied, a radix-2 charge sharing SAR ADC will be limited by comparator offset to a maximum 8-bit resolution.

Figure 7:
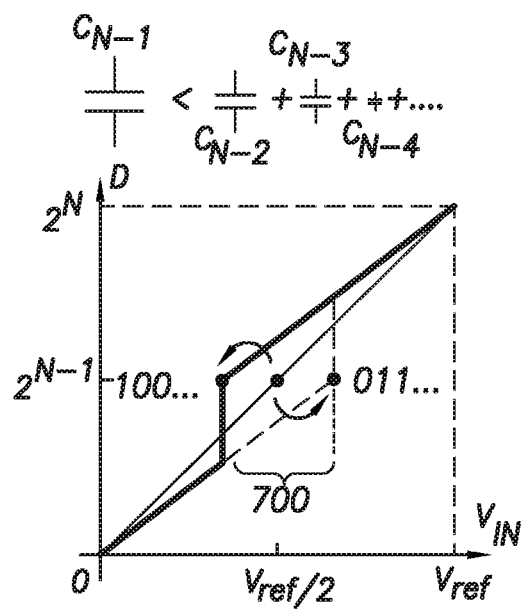
FIG. 7 is a diagram of an illustrative transfer curve of a SAR ADC with a sub-radix-2 capacitor scaling scheme in accordance with an embodiment.

In accordance with an embodiment, charge sharing SAR ADC 214 may be provided with DAC capacitors that are implemented using a sub-radix-2 sizing/scaling scheme, where for any Nth capacitor, its capacitance $C_{N-1}$ is less than the sum of the capacitances of all smaller capacitors $C_{N-2}, C_{N-3}, C_{N-4}, \ldots, C_0$. FIG. 7 is a diagram of an illustrative transfer curve of a SAR ADC with a sub-radix-2 capacitor scaling scheme. As examples, instead of a scaling factor of 2, the scaling factor may be 1.9, 1.8, 1.7, 1.5-1.9999, any number between 1 and 2, or any suitable number that is less than 2. If desired, the scaling factor need not be constant and can be optimized at each DAC capacitor. In another suitable arrangement, some of the DAC capacitors can be scaled using a factor less than 2 while some of the other DAC capacitors can be scaled using a factor of 2 (e.g., the larger DAC capacitors can be sub-radix-2 while the smaller DAC capacitors can be radix-2). As shown in FIG. 7, this provides redundancy in the transfer curve, where there is a small region or margin 700 around the decision point where an error in the decision can be recovered because the remaining capacitors that still need to be connected can cover a range that extends beyond the switching point.

The sub-radix-2 capacitor scaling scheme has traditionally been applied to other types of ADCs for improving immunity to temporal noise (i.e., to the random variation caused by shot noise, thermal noise, and a sampling noise), which can cause the comparator to make a different decision under identical conditions. The redundancy of the sub-radix-2 capacitor scaling scheme ensures a correct ADC output even when the comparator has taken a wrong decision due to temporal noise. Issues stemming from comparator offset, however, is not the type of random temporal noise that the sub-radix-2capacitor sizing scheme has conventionally been used to solve. It is therefore not obvious to design a sub-radix-2 charge sharing SAR ADC for the purpose of overcoming limitations caused by comparator offset.

Moreover, in typical SAR ADCs such as charge redistribution SAR ADCs, the comparator offset can be canceled at the output via correlated double sampling (CDS). The correlated double sampling scheme involves first sampling a reset signal, then sampling an image signal, and then subtracting the reset signal from the image signal. This subtraction operation will effectively cancel out any undesired comparator offset. CDS, however, cannot be used with charge sharing SAR ADCs to cancel out comparator offset since the effective capacitance at the input of the comparator changes every clock cycle. This further exacerbates the limitations caused by comparator offset for charge sharing SAR ADCs.

A sub-radix-2 charge sharing SAR ADC provided as a present embodiment, however, exhibits an unexpected improvement of having an increased tolerance and reduced sensitivity to comparator offset. In other words, the sub-radix-2 scaling of the DAC capacitors can provide the additional margin that is needed when the comparator offset in the voltage domain represents a predictable but different signal (charge) domain in every cycle of the conversion. A radix of 1.9 might be able to provide a margin of about 10-50 mV of comparator offset or other suitable range (as an example). As long as the change in the equivalent charge caused by the comparator offset voltage is within the redundant range, the output of the conversion will be correct. While there is still an upper limit on the allowed comparator offset, sufficiently small comparator offsets will not impact the effective number of bits (ENOB) of ADC 214. Configured in this way, charge sharing SAR ADC 214 with sub-radix-2 capacitor scaling is able to overcome the comparator offset limitations and achieve resolutions of 10 bits or more.

Figure 8A:
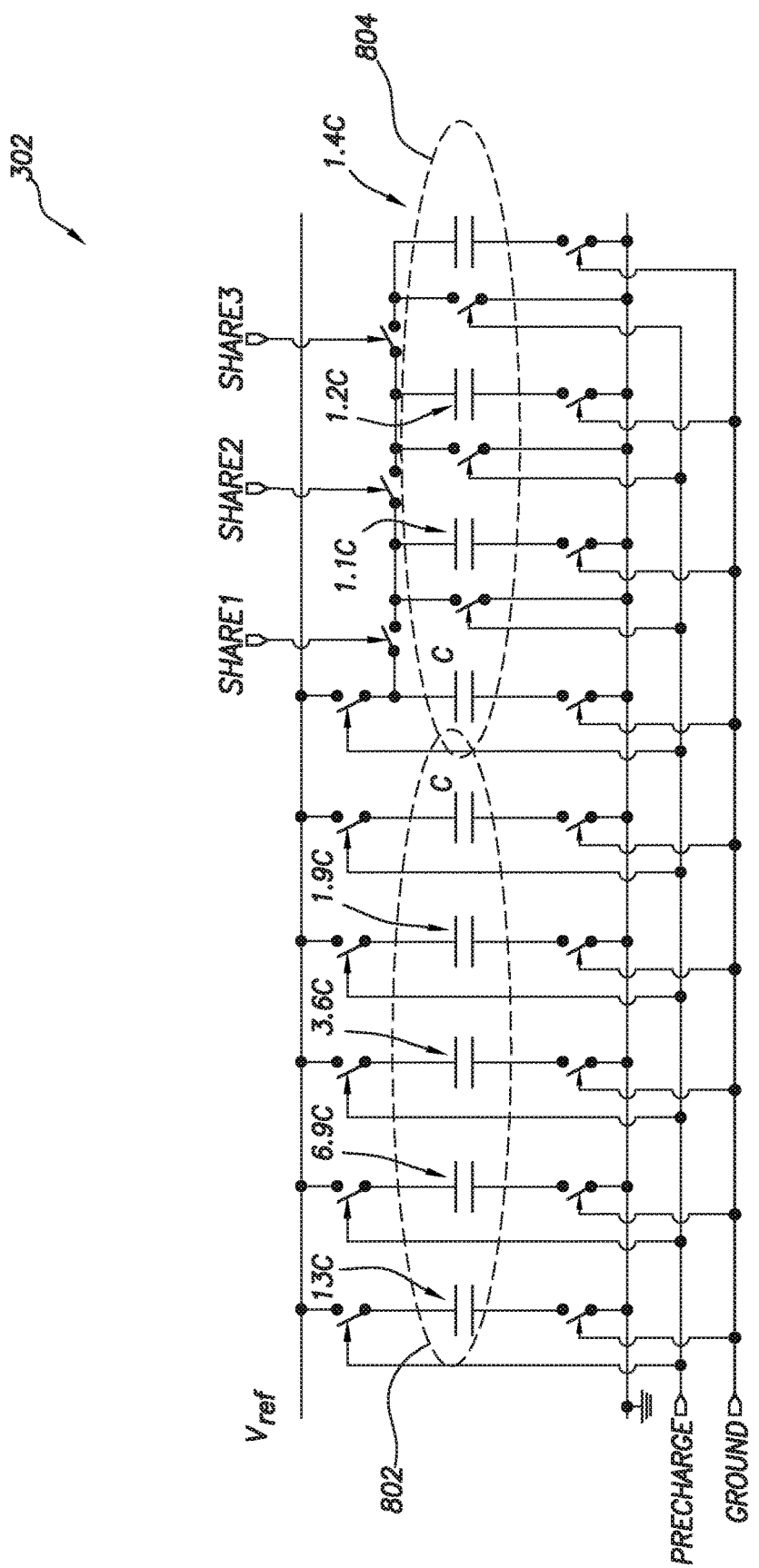
FIG. 8A is a circuit diagram of an illustrative capacitor array with scaled capacitors and charge-sharing capacitors in accordance with an embodiment.

As described above, the capacitors within DAC 302 may be scaled using a sub-radix-2 weighting scheme. In one suitable arrangement, a first portion of capacitors in DAC 302 may be scaled capacitors, whereas a second portion of capacitors in DAC 302 may be charge sharing capacitors (see, e.g., FIG. 8A). As shown in FIG. 8A, capacitors 802 may include scaled capacitors, whereas capacitors 804 may include charge sharing capacitors. Assuming a sub-radix-2 scaling factor of 1.9, scaled capacitors 802 may include capacitors with exemplary capacitances C, 1.90*C, 3.61*C (i.e., $1.9^2$C), 6.86*C (i.e., $1.9^3$C), and 13.0*C (i.e., $1.9^4$C). On the other hand, charge sharing capacitors 804 may include capacitors with exemplary capacitances C, 1.11*C (i.e. 1/0.9 C), 1.23*C (i.e., $(1/0.9)^2$C), and 1.37*C (i.e., $(1/0.9)^3$C). As can be seen in this example, the scaling factor used for the charge sharing capacitors 804 is complementary to the 1.9 sub-radix-2 scaling factor (i.e., 1/(1.9−1)=1.11). As another example, if a sub-radix factor of 1.8 were used, then the corresponding scaling factor used for the charge sharing capacitors 804 may be 1.25 (i.e., 1/(1.8−1)=1.25)

FIG. 8B is a timing diagram illustrating the operation of the capacitor array shown in FIG. 8A. As shown in FIG. 8B, all the capacitors may be pre-charged during time t1-t2 by asserting the pre-charge control signal. At time t3, a first share control signal Share1 is pulsed high to couple together the two smallest charge sharing capacitors with capacitances C and 1.11C. At time t4, a second share control signal Share2 is pulsed high to couple together the next two charge sharing capacitors with capacitances 1.11C and 1.23C. At time t5, a third share control signal Share3 is pulsed high to couple together the two largest charge sharing capacitors 1.23C and 1.37C. Operated in this way, the reference charge provided by the charge sharing capacitor with 1.11C will be 1.9× smaller than that provided by the charge sharing capacitor with C, and the charge provided by the charge sharing capacitor with 1.23C will be 1.9× smaller than that provided by the charge sharing capacitor with 1.11C. Using charge sharing capacitors sized using a scaling factor of 1.11 (or other suitable scaling factor complementary to the sub-radix-2 scaling factor) in this way can help substantially reduce the size of capacitor array 302.

Figure 9:
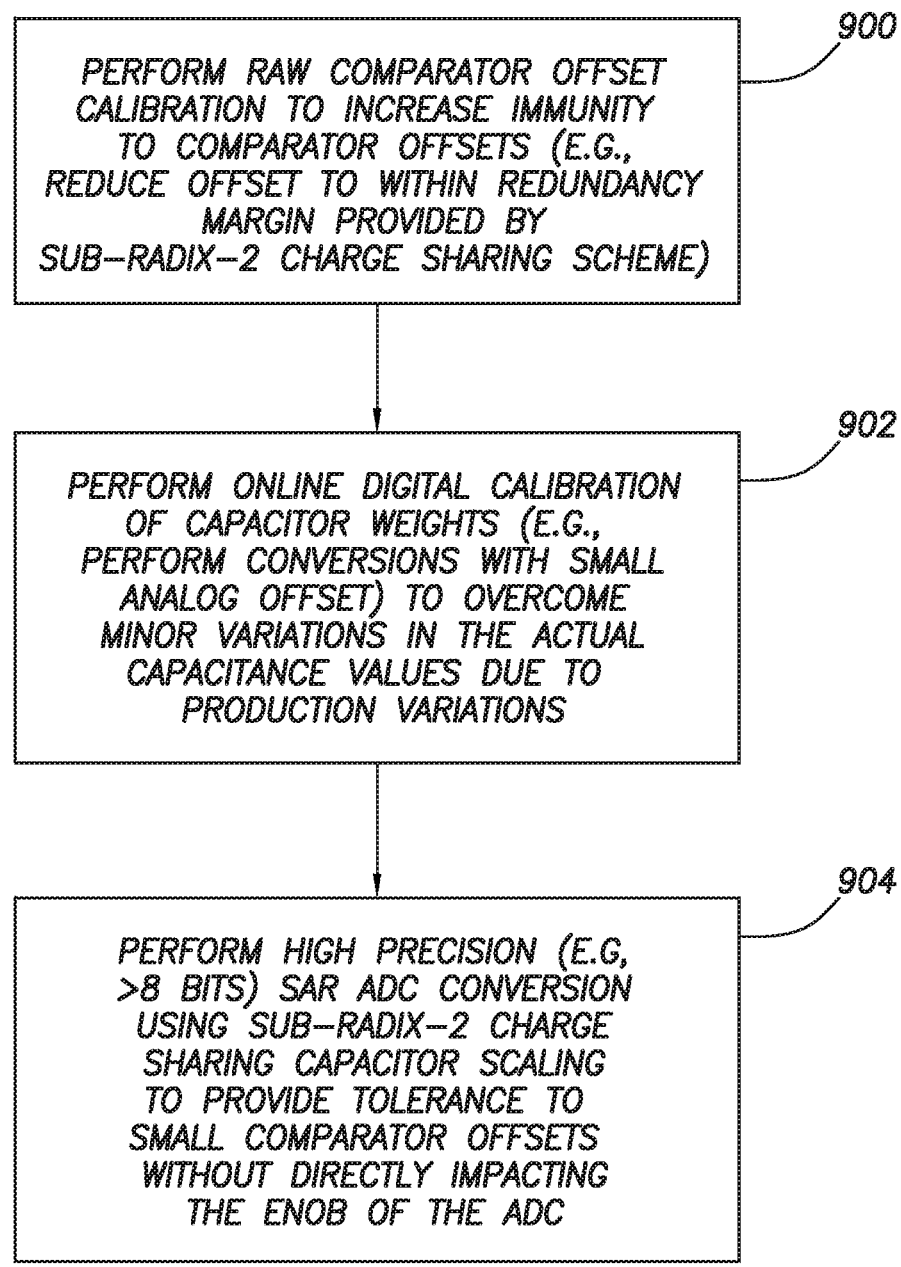
FIG. 9 is a flow chart of illustrative steps for operating a SAR ADC of the type shown in connection with at least FIGS. 5, 7, 8A, and 8B in accordance with an embodiment.

FIG. 9 is a flow chart of illustrative steps for operating a sub-radix-2 charge sharing SAR ADC 214 of the type shown in connection with at least FIGS. 5, 7, 8A, and 8B. At step 900, raw comparator offset calibration may be performed on ADC 214 to help increase the immunity to comparator offsets (e.g., to reduce the comparator offset to within a tolerable redundancy margin provided by the sub-radix-2 scaling scheme). In general, any type of comparator offset calibration method can be applied.

At step 902, online digital calibration of the capacitor weights may be performed on ADC 214 to overcome minor variations in the actual capacitance values due to production variations. For instance, a capacitor with an ideal capacitance of 1.9C might actually exhibit a capacitance of 1.91C due to process variations. In such scenarios, the digital calibration would measure and determine the actual weights of the DAC capacitors so the ensuing calculation of the codes will be accurate (e.g., digital calibration would determine that the capacitor exhibits 1.91C instead of the target 1.9C capacitance). For example, the calibration of capacitor weights might be done by converting the same input signal twice with a small analog offset between the two conversions and calculate the weights such that this fixed small analog offset results in an also fixed small digital offset. This process is repeated iteratively until all weights are calculated with sufficient accuracy.

At step 904, the calibrated charge sharing ADC may be used to perform high resolution data conversion (e.g., with resolutions of more than 8 bits, more than 9 bits, more than 10 bits, etc.) using the sub-radix-2 capacitor scaling scheme to provide improved tolerance to small comparator offsets (e.g., comparator offsets of 50 mV or less, 70 mV or less, 100 mV or less, etc.) without directly affecting the ENOB of the ADC.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

In various embodiments, an image sensor is provided that includes a plurality of image sensor pixels, an output line coupled to the plurality of image sensor pixels, and a data converter configured to receive signals from the output line. The data converter may include a comparator having a comparator offset and a digital-to-analog converter (DAC) configured to output signals that are received by the comparator. In particular, the DAC may have capacitors sized using a sub-radix-2 scaling scheme, where the sub-radix-2 scaling scheme provides a redundancy margin for improving tolerance to the comparator offset.

The data converter may be a charge sharing successive approximation register (SAR) analog-to-digital converter (ADC) with a resolution of more than 8 bits. The capacitors in the DAC may include a first set of capacitors sized using a first sub-radix-2 scaling factor and a second set of capacitors sized using a second scaling factor that is less than the first sub-radix-2 scaling factor (i.e., using a second scaling factor that is complementary to the first sub-radix-2 scaling factor). Moreover, the SAR ADC may be calibrated using a comparator offset calibration scheme and a digital calibration of weights for the capacitors in the DAC.

The foregoing is merely illustrative of the principles of this invention and various modifications can be made by those skilled in the art. The foregoing embodiments may be implemented individually or in any combination.

What is claimed is:

1. A data converter, comprising:
   a comparator configured to receive an input signal;
   a charge sharing digital-to-analog converter configured to output signals that are received by the comparator; and
   control logic configured to receive signals from the comparator and output signals to the charge sharing digital-to-analog converter, wherein the charge sharing digital-to-analog converter comprises capacitors sized using a sub-radix-2 scaling scheme.

2. The data converter of claim 1, wherein the comparator exhibits a comparator offset and wherein the sub-radix-2 scaling scheme provides a redundancy margin for improving tolerance to the comparator offset.

3. The data converter of claim 1, wherein the control logic is successive approximation register control logic.

4. The data converter of claim 3, wherein the data converter has a resolution that exceeds 8 bits.

5. The data converter of claim 3, wherein the data converter has at least 10 bits of resolution.

6. The data converter of claim 3, wherein the capacitors in the charge sharing digital-to-analog converter are all pre-charged to a known reference voltage level.

7. The data converter of claim 1, wherein the sub-radix-2 scaling scheme has a scaling factor ranging from 1.5 to 1.9999.

8. The data converter of claim 1, wherein the capacitors in the charge sharing digital-to-analog converter comprise a first set of capacitors sized using a first sub-radix-2 scaling factor and a second set of capacitors sized using a second scaling factor that is different than the first sub-radix-2 scaling factor.

9. A data converter, comprising:
a comparator having an input;
a digital-to-analog converter having a plurality of capacitors that are selectively coupled in parallel to the input of the comparator, wherein each capacitor has a respective capacitance that differs from a capacitance of at least one other capacitor by a scaling factor that is between 1.5 and 1.9999; and
control logic configured to receive signals from the comparator and output signals to the digital-to-analog converter.

10. The data converter of claim 9, wherein the digital-to-analog converter is a charge sharing digital-to-analog converter.

11. The data converter of claim 10, wherein the control logic is successive approximation register control logic.

12. The data converter of claim 11, wherein the data converter has a resolution that exceeds 8 bits.

13. The data converter of claim 11, wherein the data converter has at least 10 bits of resolution.

14. The data converter of claim 11, wherein the capacitors in the charge sharing digital-to-analog converter are all pre-charged to a known reference voltage level.

15. A data converter, comprising:
a comparator configured to receive an input signal;
a charge sharing digital-to-analog converter configured to generate an analog signal, wherein the comparator is further configured to compare the input signal to the analog signal; and
successive-approximation-register control logic configured to receive signals from the comparator and output signals to the charge sharing digital-to-analog converter, wherein the data converter has at least 9 bits of resolution.

16. The data converter of claim 15, wherein the charge sharing digital-to-analog converter includes capacitors that are all pre-charged to a known reference voltage level.

17. The data converter of claim 16, wherein the capacitors have weights that are digitally calibrated.

18. The data converter of claim 16, wherein at least some of the capacitors are scaled using a first factor that is less than 2.

19. The data converter of claim 16, wherein a first subset of the capacitors are scaled using a first factor that is less than 2 and wherein a second subset of the capacitors are scaled using a second factor that is between 1.5 to 2.

* * * * *